United States Patent
Cho et al.

(10) Patent No.: US 7,994,948 B2
(45) Date of Patent: Aug. 9, 2011

(54) TABLE GENERATION METHOD FOR DECODING VARIABLE-LENGTH CODES

(75) Inventors: Seung Hyun Cho, Daejeon (KR); Moo Kyoung Chung, Daejeon (KR); Kyung Su Kim, Seoul (KR); Jae Jin Lee, Chungcheongbuk-do (KR); Jun Young Lee, Busan (KR); Seong Mo Park, Daejeon (KR); Nak Woong Eum, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 43 days.

(21) Appl. No.: 12/474,957

(22) Filed: May 29, 2009

(65) Prior Publication Data
US 2010/0052955 A1   Mar. 4, 2010

(30) Foreign Application Priority Data
Sep. 4, 2008   (KR) .................. 10-2008-0087191

(51) Int. Cl.
*H03M 7/40* (2006.01)
(52) U.S. Cl. .................................. 341/67; 382/251

(58) Field of Classification Search .................. 341/67, 341/65, 51; 382/251, 224, 231, 232, 233, 382/234, 235, 240, 245
See application file for complete search history.

(56) References Cited

U.S. PATENT DOCUMENTS

| 6,563,441 B1 * | 5/2003 | Gold .......................... 341/67 |
| 6,891,976 B2 | 5/2005 | Zheltov et al. |
| 7,348,902 B2 | 3/2008 | Pisarevsky et al. |
| 2004/0021593 A1 | 2/2004 | Park et al. |

FOREIGN PATENT DOCUMENTS
KR   2004-0012403 A   2/2004

OTHER PUBLICATIONS

Yong Ho Moon et al., "An efficient decoding of CAVLC in H.264/AVC video coding standard", IEEE Transactions on Consumer Electronics, vol. 51, No. 3, Aug. 2005, pp. 933-938.

* cited by examiner

*Primary Examiner* — Joseph Lauture
(74) *Attorney, Agent, or Firm* — Rabin & Berdo, P.C.

(57) ABSTRACT

Provided is a table generation method of decoding a variable-length code. The table generation method includes receiving a variable-length code table and a search width N, generating a K-ary tree from the variable-length code table and the search width N, and generating an N-bit code table from the K-ary tree.

10 Claims, 6 Drawing Sheets

```
prevBitsLeft = 0;
nextRowNumber = 0;
mergeVal = 0;
prefixCnt = 0;

parent = ROOT_NODE;

while (!END_OF_LIST){
   if (parent.type == TYPE_A || parent.maxLeafChildWidth == N) {
      currBitsLeft = 0;
      parent.nextRowNumber = nextRowNumber;
      parent.prefixLength = 0;
      nextRowNumber = nextRowNumber + 1;
   }
   else {
      currBitsLeft = N - parent.maxLeafChildWidth;
      parent.nextRowNumber = nextRowNumber;
      parent.prefixLength = currBitsLeft;
      If (mergeVal == 0) parent.prefix = 0;
      else parent.prefix = prefixCnt * 2^(currBitsLeft - prevBitsLeft);
      prefixCnt = parent.prefix + 1;
      mergeVal = mergeVal + 2^(parent.maxLeafChildWidth);
      if (mergeVal == 2^N) {
         mergeVal = 0;
         prefixCnt = 0;
         nextRowNumber = nextRowNumber + 1;
      }
   }
   prevBitsLeft = currBitsLeft;
   parent = NEXT_NODE_ON_LIST;
}
```

TABLE GENERATION METHOD FOR DECODING VARIABLE-LENGTH CODES

CROSS-REFERENCE TO RELATED APPLICATIONS

This application claims the priority of Korean Patent Application No. 10-2008-87191 filed on Sep. 4, 2008, in the Korean Intellectual Property Office, the disclosure of which is incorporated herein by reference.

BACKGROUND OF THE INVENTION

1. Field of the Invention

The present invention relates to a table generation method for decoding variable-length codes, and more particularly, to a method for generating an N-bit code table from a variable-length code table in order to efficiently decode the variable-length codes from an input bit stream of compressed video, sound, etc.

2. Description of the Related Art

In general, when a decoding system using a variable-length code table is used, frequent accesses to memory are inevitable in order to find a codeword matching an input bit stream.

Many technologies for decoding an input bit stream using the variable-length code table have been proposed in order to solve such an inconvenience. However, prior-art technologies have limitations within an applicable range. For example, the prior-art technologies may apply to only an input bit steam compressed into a specific format or apply to only a codeword having a specific bit pattern, or may reduce the memory accesses to only some tables.

Accordingly, these prior-art technologies have problems in that different technologies should be applied to decode the videos and sounds, which are compressed into different formats, at one device.

SUMMARY OF THE INVENTION

An aspect of the present invention provides a method for generating an N-bit code table from a variable-length code table in order to efficiently decode a variable-length code from input bit streams such as videos or sounds, which are compressed into different formats.

According to an aspect of the present invention, there is provided a table generation method for decoding a variable-length code, the method including: receiving a variable-length code table and a search width N; generating a K-ary tree from the variable-length code table and the search width N; and generating an N-bit code table from the K-ary tree.

The character 'K' in the K-ary tree and 'N' of the search width N may satisfy requirements represented by the equation:

$$K=2^N.$$

The generating of the K-ary tree may includes: inserting a root node and assigning the root node to a current node; receiving one codeword from the variable-length code table; comparing a length of the codeword with the search width N; and inserting a leaf node having the codeword into a child node of the current node when the length of the codeword is shorter than or equal to the search width N in the comparison of the length of the codeword with the search width N.

The table generation method for decoding a variable-length code may further include: cutting the codeword by N bits when the length of the codeword is longer than the search width N in the comparison of the length of the codeword with the search width N; determining whether an internal node including the cut-off N-bit code exists in the child nodes of the current node; assigning the internal node including the cut-off N-bit code to the current node when the determination is proven to be true, wherein, after the assigning of the internal node to the current node, the comparing of the length of the codeword, the inserting of the leaf node, the cutting of the codeword, the determination, and the assigning of the internal node to the current node are repeatedly performed until a leaf node for the received codeword is generated.

The table generation method for decoding a variable-length code may further include inserting an internal node having the N-bit code into the child node of the current node and assigning the internal node to the current node when the determination is proven to be false, wherein, after the inserting of the internal node, the comparing of the length of the codeword, the inserting of the leaf node, the cutting of the codeword, the determination, the assigning of the internal node to the current node, and the inserting of the internal node are repeatedly performed until a leaf node for the received codeword is generated.

The inserting of the root node, the receiving of one codeword, the comparing of the length of the codeword, the inserting of a leaf node, the cutting of the codeword, the determination, the assigning of the internal node to the current code, and the inserting of the internal node may be repeatedly performed with respect to all codewords included in the variable-length code table.

The generating of the N-bit code table may include: generating an internal node list including all internal nodes which belong to the K-ary tree; sequentially assigning one line of the N-bit code table to the internal nodes of type A one by one with an increase in the line number from the first node of the internal node list and assigning a mediator to the internal nodes of type B; and storing predetermined data in each entry of the N-bit code table by sequentially traversing each internal node of the internal node list, wherein the internal node of the type A is an internal node having one or more internal nodes as a child node, and the internal node of the type B is an internal node having only leaf nodes as the child node.

In this case, a length of the mediator may be equal to a value obtained by subtracting the maximum length of codes stored in the child nodes of a corresponding internal node from the search width N.

In the generating of the internal node list, the internal node of the type A may have priority over the internal node of the type B in order to sort the internal nodes when the internal nodes have different types, the internal node having a smaller number may have priority over the internal node having a greater number when the internal nodes have the same type A, and the internal node having a relatively higher maximum length of the codes stored in the child nodes of the corresponding internal node may have a relative priority when the internal nodes have the same type B.

In the storing of the predetermined data in each entry of the N-bit code table, a location of the entry may be determined by the code of the child node when the child node is an internal node or a leaf node having the same code length as the search width N, and determined by a combination of a mediator of a currently traversing internal node and a code of the child node when the child node is a leaf node having a shorter code length than the search width N.

In the storing of the predetermined data in each entry of the N-bit code table, when the child node assigned to the corresponding entry is a leaf node, a value '0' as an additional search value, and a code length and a symbol of the assigned child node may be stored; and when the child node assigned to the corresponding entry is an internal node, a value '1' as the additional search value, and a mediator length, a mediator and a next line number of the assigned child node may be stored.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. However, detailed descriptions related to well-known functions or configurations will be omitted in order not to unnecessarily obscure subject matters of the present invention. Moreover, in the accompanying drawings, like reference numerals refer to like elements throughout the specification.

Figure 1:
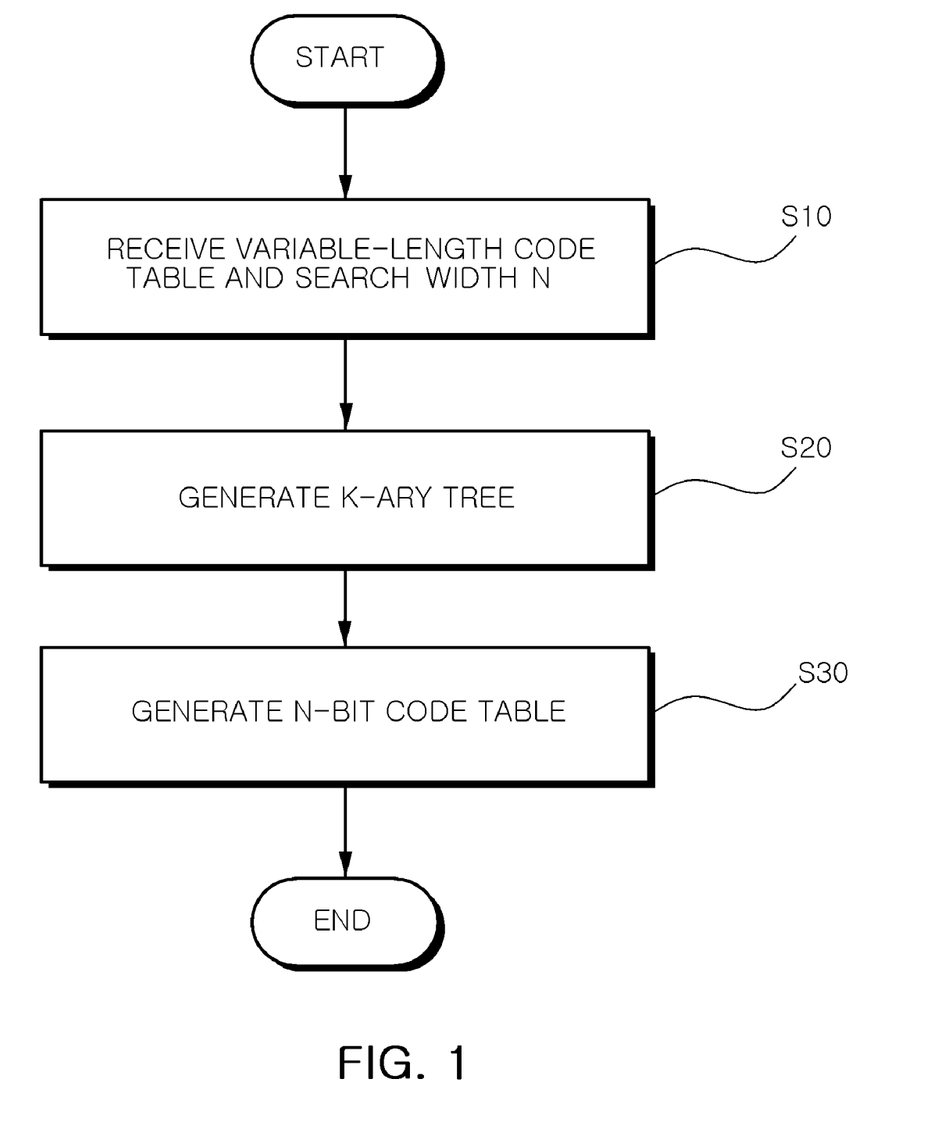
FIG. 1 is a flowchart illustrating a table generation process for decoding variable-length codes according to an embodiment of the present invention.

FIG. 1 is a flowchart illustrating a table generation process for decoding variable-length codes according to an embodiment of the present invention.

Referring to FIG. 1, the table generation method according to the embodiment of the present invention generally includes receiving a variable-length code table and a search width N (Operation S10), generating a K-ary tree from the variable-length code table and the search width N (Operation S20), and generating an N-bit code table from the K-ary tree (Operation S30). The N-bit code table generated in accordance with the above process is stored in a memory, and used to decode variable-length codes.

The K-ary tree refers to a tree in which one node has the maximum number 'K' of child nodes including the sum of the number of internal nodes and the number of leaf nodes. Here, the internal node is a node having one or more child nodes, and the leaf node is a node having no child node. Also, the character 'K' of the K-ary tree and 'N' of the search width N have a relationship of $K=2^N$ according to an embodiment of the present invention.

Hereinafter, a method for generating a K-ary tree from a variable-length code table and a search width N is described in more detail with reference to FIGS. 2 and 3.

Figure 2:
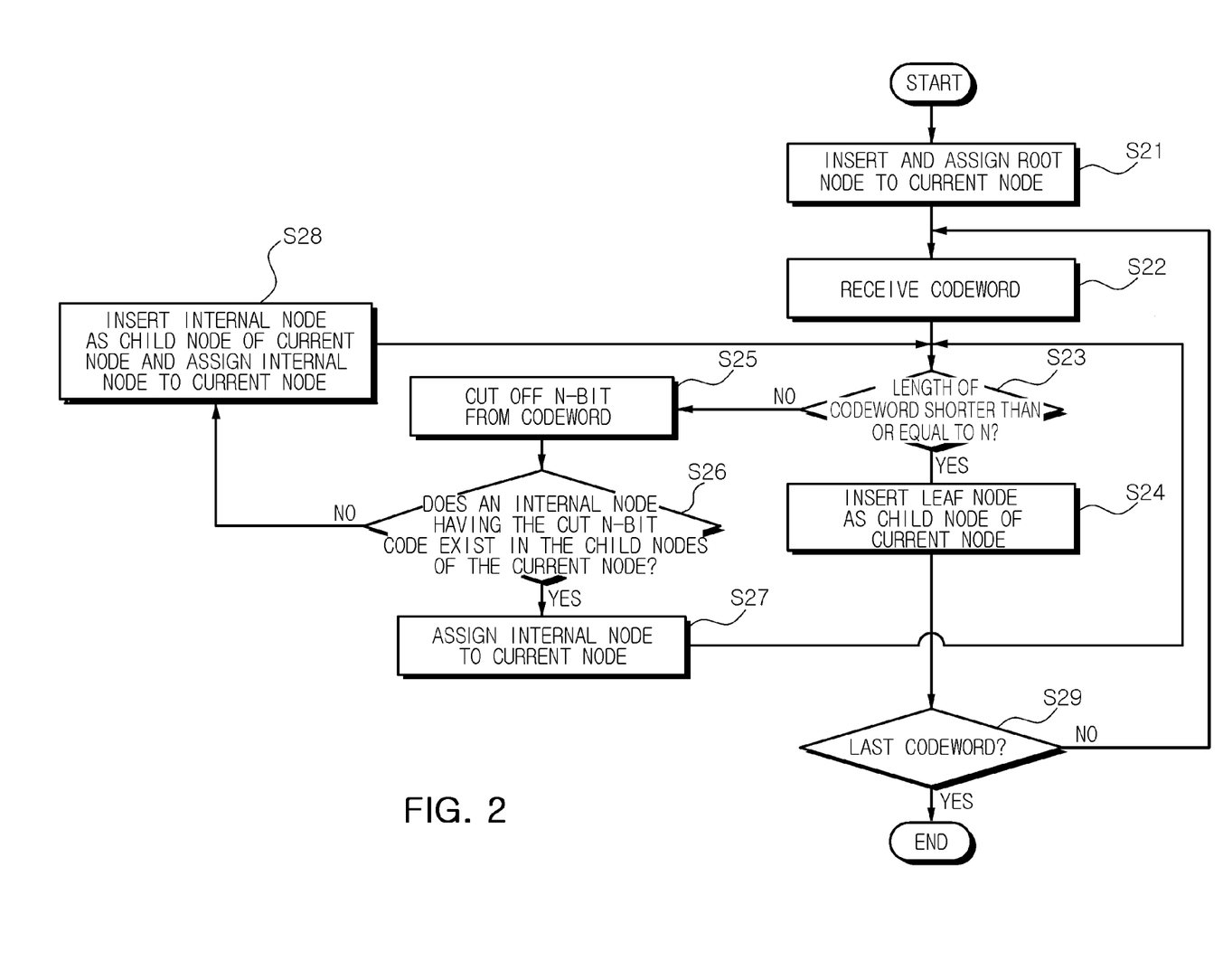
FIG. 2 is a detailed flowchart illustrating a process of generating a K-ary tree.

FIG. 2 is a detailed flowchart illustrating a process of generating a K-ary tree.

Referring to FIG. 2, a root node is inserted and assigned to a current node (Operation S21), and one codeword is inputted from the variable-length code table (Operation S22).

Then, the length of the codeword is compared with a search width N (Operation S23). As a result of the comparison, when the length of codeword is shorter than or equal to the search width N, a new leaf node is inserted as a child node of the current node, so that the new leaf node can have the codeword (Operation S24).

When the length of codeword is longer than the search width N, the codeword is cut off by N bits (Operation S25), and it is then determined whether an internal node having the cut-off N-bit code exists in the child nodes of the current node (Operation S26).

When the determination in operation S26 is proven to be true, the internal node having the N-bit code is assigned to the current node (Operation S27). When the determination is proven to be false, a new internal node is inserted as a child node of the current node so as to have the N-bit code and assigned to the current node (Operation S28).

Next, a length of the remaining code after the codeword is cut by N bits is compared with the search width N (Operation of S23). The operations S24 to S28 are repeatedly performed according to the comparison. In this case, Operations S24 to S28 are repeatedly performed until a leaf node for the inputted codeword is inserted.

Meanwhile, operations S22 to S28 are repeatedly performed with respect to all codewords included in the inputted variable-length code table.

Subsequently, leaf nodes are inserted one by one to correspond respectively to all the codewords included in the variable-length code table. Also, a symbol allocated to the corresponding codeword is also stored in each leaf node.

Figure 3:
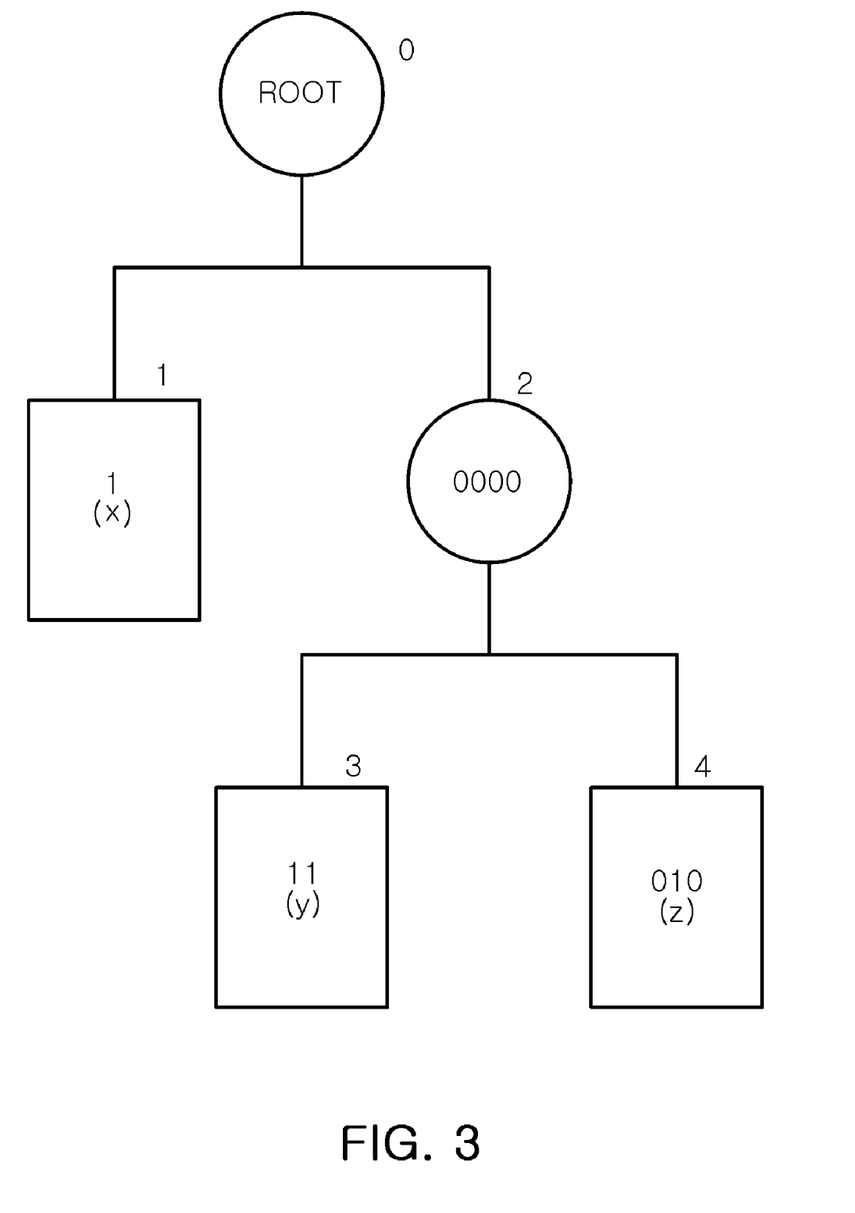
FIG. 3 is a diagram illustrating an example of a K-ary tree generated according to the process as shown in FIG. 2.

FIG. 3 is a diagram illustrating an example of a K-ary tree generated in accordance with the process as shown in FIG. 2. An inputted search width N is 4. The variable-length code table is listed in Table 1. A codeword is expressed in a binary number.

TABLE 1

| Symbol | Codeword |
| --- | --- |
| X | 1 |
| Y | 000011 |
| Z | 0000010 |

More concretely, when the variable-length code table as in Table 1 and a value '4' as the search width N are inputted, the root node 0 is inserted and assigned to a current node, and then one codeword, i.e. a codeword '1,' is inputted from the variable-length code table.

Because the length of codeword '1' is shorter than the search width '4', a new leaf node 1 having the codeword '1' is inserted as a child node of the root node 0 which is the current node. Then, the symbol 'X' allocated to a codeword '1' is together stored at the leaf node 1.

Then, the process as shown in FIG. 2 is also performed with respect to the codewords '000011' and '0000010' included in the variable-length code. As a result, the K-ary tree as shown in FIG. 3 is generated.

Referring to FIG. 3, the internal node and the leaf node may be expressed as a circle and a square, respectively. A node number marked on an upper right corner of each node is numbered in the order of the generation of nodes. The bit codes allocated to the nodes are stored at the remaining nodes except for the root node. The symbol of the corresponding codeword is additionally stored at the leaf node.

The stored values with respect to each node are listed in Table 2.

TABLE 2

| Node No. | Code | Code Length | Symbol | No. of Parent Nodes | No. of Child Nodes |
|---|---|---|---|---|---|
| 0 | — | — | — | — | 1 and 2 |
| 1 | 1 | 1 | X | 0 | — |
| 2 | 0 | 4 | — | 0 | 3 and 4 |
| 3 | 3 | 2 | Y | 2 | — |
| 4 | 2 | 3 | Z | 2 | — |

Hereinafter, a method for generating an N-bit code table from a K-ary tree is described in more detail with reference to FIGS. 4 and 5.

An internal node list which contains all internal nodes belonging to the K-ary tree generated by the above process is generated.

All the internal nodes belonging to the K-ary tree are classified into the following two types.

Type A is an internal node having one or more internal nodes as a child node

Type B is an internal node whose child nodes all are leaf nodes

The type A has priority over the type B in the internal node list when the two internal nodes have different types. That is, the type A precedes the type B in the internal node list. When the two internal nodes have the same type A, an internal node having a smaller node number has priority over an internal node having a greater node number. When the two internal nodes have the same type B, an internal node having a relatively higher maximum length of the codes stored in the child nodes of the corresponding internal node may have a relative priority. Thus, in any case, a root node becomes a first node in the internal node list.

Next, lines of the N-bit code table are sequentially assigned to the internal nodes of the type A one by one with an increase in the line number from the first node of the sorted internal node list. On the other hand, mediators are assigned to the internal nodes of the type B. The mediator is expressed as a binary number. The length of the mediator is equal to a value obtained by subtracting the maximum length of codes stored in the child nodes of the corresponding internal node from the search width N. Thus, it is possible to minimize the number of lines of the generated N-bit code table by enabling as many nodes as possible to share one line because the mediators rather than the lines of the N-bit code table are assigned to the internal nodes of the type B.

Figure 4:
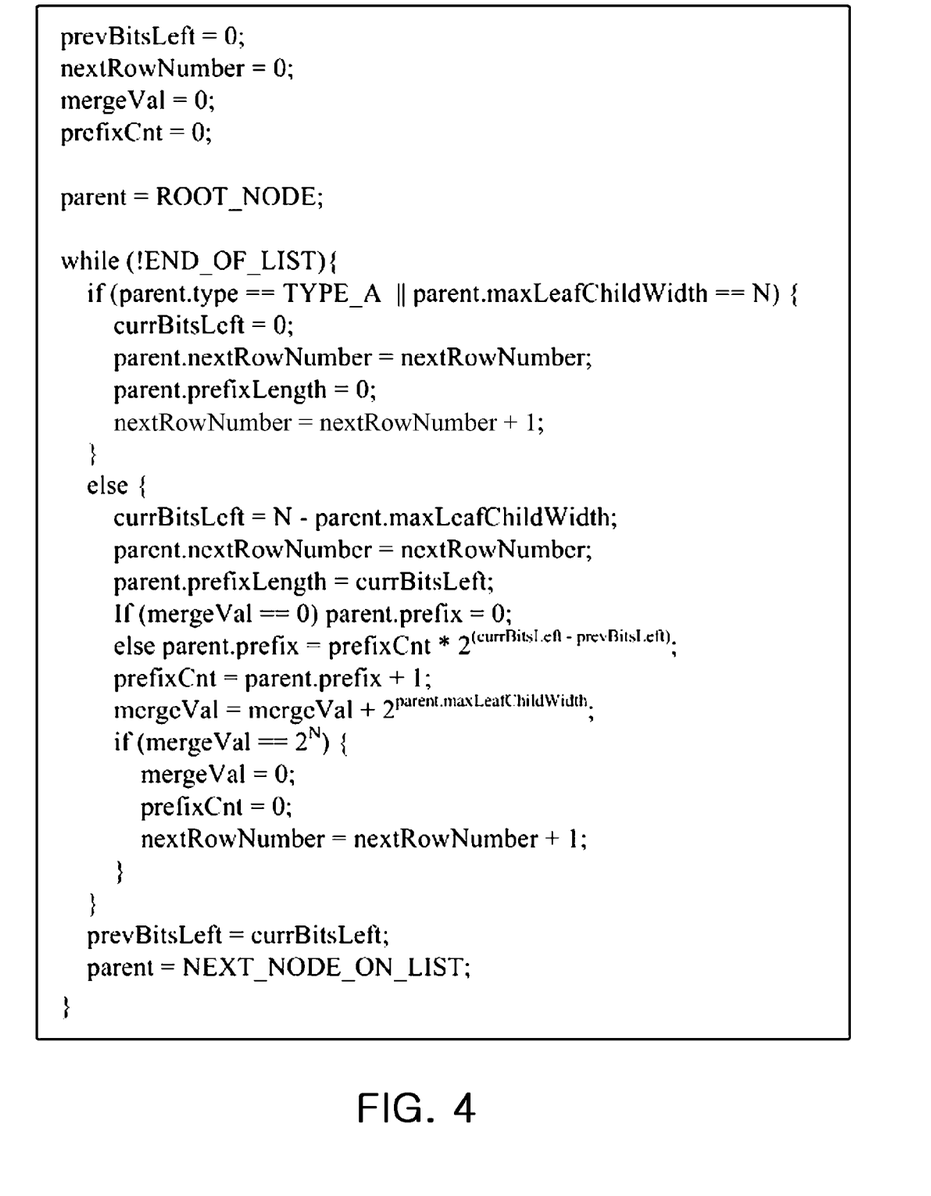
FIG. 4 is a diagram illustrating a process of assigning a line of an N-bit code table or a mediator to each node of a sorted internal node list using pseudo code.

FIG. 4 is a diagram illustrating a process of assigning a line of an N-bit code table or a mediator to each node of the sorted internal node list using pseudo code.

Referring to FIG. 4, the assigning process is performed with respect to all nodes included in the sorted internal node list. The pseudo code as shown in FIG. 4 is used to provide an exemplary embodiment of the process of assigning the lines of the N-bit code table or the mediator. Accordingly, the assigning process is not limited to the exemplary embodiment of the present invention using the pseudo code as shown in FIG. 4.

Next, starting from the first node of the sorted internal node list, data is stored in the N-bit code table by sequentially traversing each internal node. One line of the N-bit code table includes $2^N$ entries. Data of the corresponding child node are stored in an entry location determined by the mediator of the currently traversing internal node and the code of the child node.

More concretely, when the corresponding child node is the internal node, or a leaf node having the same code length as the search width N, the entry location where the data will be stored is determined only by the code of the child node. On the other hand, when the corresponding child node is a leaf node having a shorter code length than the search width N, the entry location is determined by a combination of the mediator of the currently traversing internal node and the code of the child node.

Figure 5A:
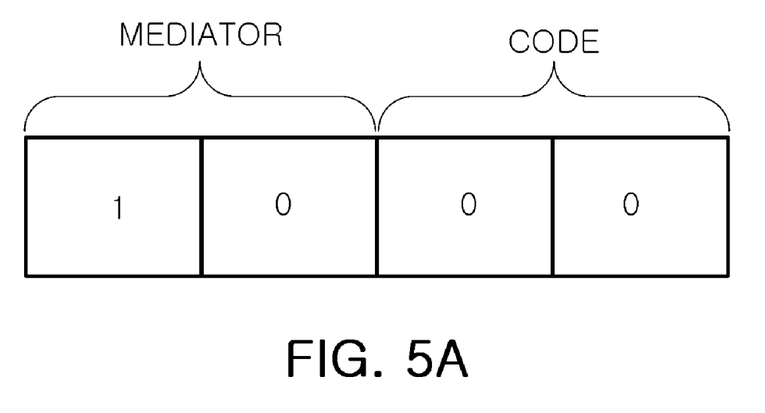
FIGS. 5A and 5B are diagrams illustrating methods for assigning an entry location by combining a mediator of a currently traversing internal node and a code of a child node.
Figure 5B:
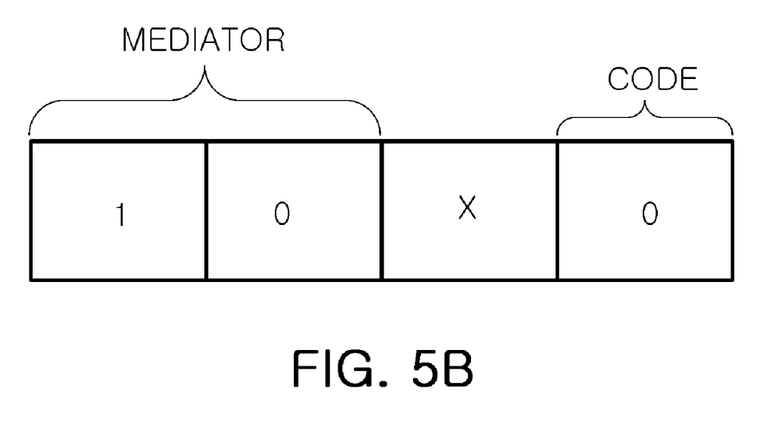

FIGS. 5A and 5B are diagrams illustrating methods for assigning an entry location by combining a mediator of the currently traversing internal node and a code of a child node.

Referring to FIGS. 5A and 5B, the search width N, the length of the mediator, the mediator and the code of child node are set to constant values of 4, 2, 2, and 0, respectively. However, the code lengths are set to different values of 2 and 1, respectively. As shown in FIG. 5A, when the total length of the code and the mediator is equal to the search width N, one entry location, i.e. entry No. 8, is assigned by the binary number obtained from a combination of the mediator and the codes. On the other hand, as shown in FIG. 5B, when the total length of the code and the mediator is shorter than the search width N, two or more entries may be assigned. For example, when the location 'X' in FIG. 5B is set to 0 or 1, the entry location, i.e. entry No. 8 or 10, is assigned by the binary number obtained from the combination of the mediator and the code.

Data stored in each of the assigned entries as described above vary in accordance with the types of nodes assigned to the corresponding entries. More concretely, when a node assigned to the corresponding entry is the leaf node, a value '2' is stored in an 'addition search' field. Also, the code length and the symbol of the assigned node are stored. On the contrary, when a node assigned to the corresponding entry is an internal node, a value '1' is stored in the 'addition search' field. Also, the length of the mediator, the mediator, and the next line number of the assigned node are stored. Thus, it is possible to save a memory space necessary to store one entry because the types of stored data vary in accordance with the types of the nodes assigned to the entry.

Figure 6:
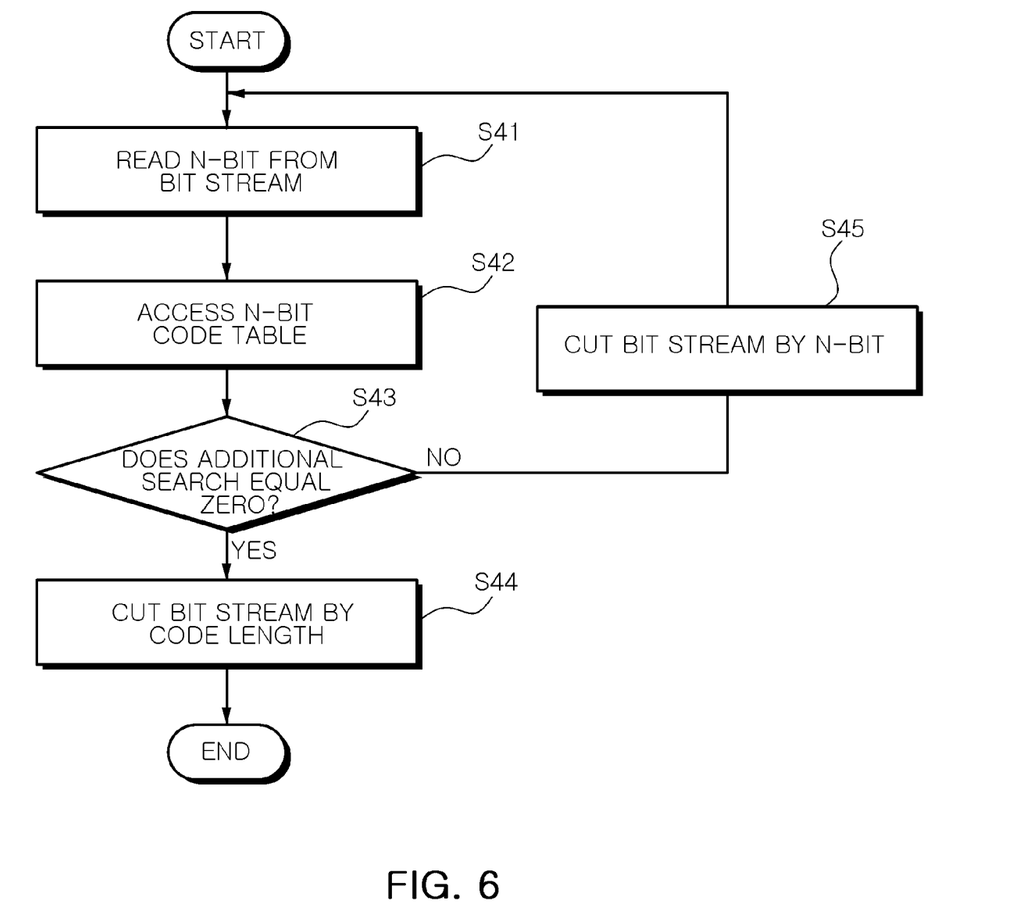
FIG. 6 is a flowchart illustrating a process of decoding a variable-length code using a generated N-bit code table according to an embodiment of the present invention.

FIG. 6 is a flowchart illustrating a process of decoding a variable-length code using a generated N-bit code table according to an embodiment of the present invention.

An N-bit code is read from a bit stream of the variable-length code to be decoded (Operation S41), and an access to the N-bit code table is performed (Operation S42). When the first access to the N-bit code table is performed, the first line of the N-bit code table is accessed. When an additional access to the N-bit code table is performed, a line indicated by the next line number in the previous access is accessed. Next, an additional search value is verified (Operation S43). When the additional search value is 0, the bit stream is cut off as much as the code length (Operation S44). When the additional search value is 1, the bit stream is cut off by N bits (Operation S45). After this operation, operations S41 to S45 are repeatedly performed.

The table generation method for decoding variable-length codes according to embodiments of the present invention can be useful to apply to all types of variable-length code tables, and to easily generate an N-bit code table. Also, the generated N-bit code table may be used to significantly reduce an average memory access frequency necessary to decode a variable-length code. Furthermore, the table generation method according to embodiments of the present invention can be useful to exactly predict and regulate a maximum memory access frequency and a necessary memory capacity, and thus to control the maximum memory access frequency and the necessary memory capacity by adjusting a search width N.

While the present invention has been shown and described in connection with the exemplary embodiments, it will be apparent to those skilled in the art that modifications and variations can be made without departing from the scope of the invention as defined by the appended claims.

What is claimed is:

1. A table generation method for decoding a variable-length code, comprising:
   receiving a variable-length code table and a search width N;
   generating a K-ary tree from the variable-length code table and the search width N; and
   generating an N-bit code table from the K-ary tree,
   wherein the character 'K' in the K-ary tree and 'N' of the search width satisfy requirements represented by the equation: $K=2^N$.

2. A table generation method for decoding a variable-length code, comprising:
   receiving a variable-length code table and a search width N;
   generating a K-ary tree from the variable-length code table and the search width N; and
   generating an N-bit code table from the K-ary tree,
   wherein the generating of the K-ary tree comprises:
      inserting a root node and assigning the root node to a current node;
      receiving one codeword from the variable-length code table;
      comparing a length of the codeword with the search width N; and
      inserting a leaf node having the codeword into a child node of the current node when the length of the codeword is shorter than or equal to the search width N in the comparison of the length of the codeword with the search width N.

3. The method of claim 2, further comprising:
   cutting the codeword by N-bit when the length of the codeword is longer than the search width N in the comparison of the length of the codeword with the search width N;
   determining whether an internal node including the cut-off N-bit code exists in the child nodes of the current node;
   assigning the internal node including the cut-off N-bit code to the current node when the determination is proven to be true,
   wherein, after the assigning of the internal node to the current node, the comparing of the length of the codeword, the inserting of the leaf node, the cutting of the codeword, the determination, and the assigning of the internal node are repeatedly performed until a leaf node for the received codeword is generated.

4. The method of claim 3, further comprising inserting a internal node having the N-bit code into the child node of current node and assigning the internal node to the current node when the determination is proven to be false, wherein, after the inserting of the internal node, the comparing of the length of the codeword, the inserting of the leaf node, the cutting of the codeword, the determination, the assigning of the internal node to the current node, and the inserting of the internal node are repeatedly performed until a leaf node for the received codeword is generated.

5. The method of claim 4, wherein the inserting of the root node, the receiving of one codeword, the comparing of the length of the codeword, the inserting of a leaf node, the cutting of the codeword, the determination, the assigning of the internal node, and the inserting of the internal node are repeatedly performed with respect to all codewords included in the variable-length code table.

6. A table generation method for decoding a variable-length code, comprising:
   receiving a variable-length code table and a search width N;
   generating a K-ary tree from the variable-length code table and the search width N; and
   generating an N-bit code table from the K-ary tree,
   wherein the generating of the N-bit code table comprises:
      generating an internal node list comprising all internal nodes which belong to the K-ary tree;
      sequentially assigning one line of the N-bit code table to the internal nodes of type A one by one with an increase in the line number from the first node of the internal node list and assigning a mediator to the internal nodes of type B; and
      storing predetermined data in each entry of the N-bit code table by sequentially traversing each internal node of the internal node list,
      wherein the internal node of the type A is an internal node having one or more internal nodes as a child node, and the internal node of the type B is an internal node having only leaf nodes as the child node.

7. The method of claim 6, wherein a length of the mediator equals to a value obtained by subtracting the maximum length of codes stored in the child nodes of a corresponding internal node from the search width N.

8. The method of claim 6, wherein, in the generating of the internal node list, the internal node of the type A has priority over the internal node of the type B in order to sort the internal nodes when the internal nodes have different types,
   wherein the internal node having a smaller number has priority over the internal node having a greater number when the internal nodes have the same type A, and the internal node having a relatively higher maximum length of the codes stored in the child nodes of the corresponding internal node has a relative priority when the internal nodes have the same type B.

9. The method of claim 6, wherein, in the storing of the predetermined data, a location of the entry is determined by the code of the child node when the child node is an internal node or a leaf node having the same code length as the search width N, and is determined by a combination of a mediator of a currently traversing internal node and a code of the child node when the child node is a leaf node having a shorter code length than the search width N.

10. The method of claim 6, wherein, in the storing of the predetermined data, when the child node assigned to the corresponding entry is the leaf node, a value '0' as an additional search value, and a code length and a symbol of the assigned child node are stored; and
   when the child node assigned to the corresponding entry is the internal node, a value '1' as the additional search value, and a mediator length, a mediator and a next line number of the assigned child node are stored.

* * * * *